US009727462B2

United States Patent
Nguyen et al.

(10) Patent No.: US 9,727,462 B2
(45) Date of Patent: Aug. 8, 2017

(54) RUNTIME BACKUP OF DATA IN A MEMORY MODULE

(71) Applicant: Hewlett Packard Enterprise Development LP, Houston, TX (US)

(72) Inventors: Vincent Nguyen, Houston, TX (US); Binh Nguyen, Houston, TX (US); William C. Hallowell, Houston, TX (US); Raghavan V. Venugopal, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/435,167

(22) PCT Filed: Jan. 30, 2013

(86) PCT No.: PCT/US2013/023743
§ 371 (c)(1),
(2) Date: Apr. 12, 2015

(87) PCT Pub. No.: WO2014/120140
PCT Pub. Date: Aug. 7, 2014

(65) Prior Publication Data
US 2015/0261672 A1    Sep. 17, 2015

(51) Int. Cl.
*G06F 3/06* (2006.01)
*G06F 12/0804* (2016.01)
*G11C 14/00* (2006.01)

(52) U.S. Cl.
CPC ........ *G06F 12/0804* (2013.01); *G06F 3/0619* (2013.01); *G06F 3/0656* (2013.01);
(Continued)

(58) Field of Classification Search
CPC .. G06F 12/0804; G06F 3/0619; G06F 3/0656; G06F 3/0685; G06F 2003/0691;
(Continued)

(56) References Cited

U.S. PATENT DOCUMENTS 7,237,070 B2    6/2007  Guthrie et al.
2008/0126690 A1*  5/2008  Rajan ...................... G06F 12/06
                                                        711/105
(Continued)

FOREIGN PATENT DOCUMENTS

CN          1264128      8/2000
CN        101263461      9/2008
(Continued)

OTHER PUBLICATIONS

International Searching Authority, The International Search Report and the Written Opinion, Oct. 25, 2013; 9 pages.
(Continued)

*Primary Examiner* — Hal Schnee
(74) *Attorney, Agent, or Firm* — Trop, Pruner & Hu, P.C.

(57) ABSTRACT

During runtime of a system, a memory controller is caused to relinquish control of a memory module that includes a volatile memory and a non-volatile memory. After the triggering, an indication is activated to the memory module, the indication causing a backup operation in the memory module, the backup operation being controlled by an internal controller in the memory module, and the backup operation involving a transfer of data from the volatile memory to the non-volatile memory in the memory module.

15 Claims, 4 Drawing Sheets

(52) U.S. Cl.
CPC ........ G06F 3/0685 (2013.01); G11C 14/0018 (2013.01); G06F 2003/0691 (2013.01); G06F 2212/1032 (2013.01); G06F 2212/202 (2013.01)

(58) Field of Classification Search
CPC ....... G06F 2212/1032; G06F 2212/202; G06F 3/0611; G06F 3/0625; G06F 3/0658; G06F 2212/205; G11C 14/0018
See application file for complete search history.

(56) References Cited

U.S. PATENT DOCUMENTS

| | | |
|---|---|---|
| 2009/0089514 A1 | 4/2009 | Srivastava et al. |
| 2009/0182962 A1 | 7/2009 | Khmelnitsky et al. |
| 2010/0008175 A1 | 1/2010 | Sweere et al. |
| 2010/0174934 A1 | 7/2010 | Zhao et al. |
| 2010/0202238 A1* | 8/2010 | Moshayedi ......... G06F 11/1658 365/228 |
| 2011/0113208 A1* | 5/2011 | Jouppi ................ G06F 11/1438 711/162 |
| 2011/0225465 A1 | 9/2011 | Blackmon et al. |
| 2011/0283070 A1 | 11/2011 | Rischar et al. |
| 2012/0317382 A1 | 12/2012 | Steed |
| 2013/0086309 A1* | 4/2013 | Lee ..................... G06F 12/0246 711/103 |
| 2013/0120925 A1* | 5/2013 | Park .................... G06F 12/0238 361/679.31 |
| 2015/0127890 A1* | 5/2015 | Brainard ............. G06F 13/1694 711/103 |

FOREIGN PATENT DOCUMENTS

| | | |
|---|---|---|
| CN | 101788938 | 7/2010 |
| CN | 102016808 | 4/2011 |
| CN | 102436419 | 5/2012 |
| CN | 102567139 | 7/2012 |

OTHER PUBLICATIONS

Therdsteerasukdi, K. et al., Utilizing Radio-Frequency Interconnect for a Many-DIMM DRAM System, (Research Paper), Journal on Emerging and Selected Topics in Circuits and Systems, Jun. 2012, pp. 210-227, vol. 2, No. 2.
CN First Office Action dated Nov 8, 2016, CN Patent Application No. 201380061044.9 dated Jan 30, 2013, State Intellectual Property Office of the P.R. China, 8 pages.

* cited by examiner

RUNTIME BACKUP OF DATA IN A MEMORY MODULE

BACKGROUND

A system can include various types of storage devices, including a persistent secondary storage (e.g. disk-based storage or solid state storage) and an intermediate storage. The intermediate storage can be implemented with a higher-speed storage device than used in the persistent secondary storage. Examples of storage devices that can be used in the intermediate storage include dynamic random access memories (DRAMs), static random access memories (SRAMs), flash memories, and so forth.

The intermediate storage can be used to cache a portion of the data that is in the persistent secondary storage. Some of the cached data may be updated during operation of the system, which can cause the updated data in the intermediate storage to be more up-to-date than the corresponding data in the persistent secondary storage. Updated data in the intermediate storage may be subject to loss in case of a fault in the system.

BRIEF DESCRIPTION OF THE DRAWINGS

Some embodiments are described with respect to the following figures.

DETAILED DESCRIPTION

Figure 1:
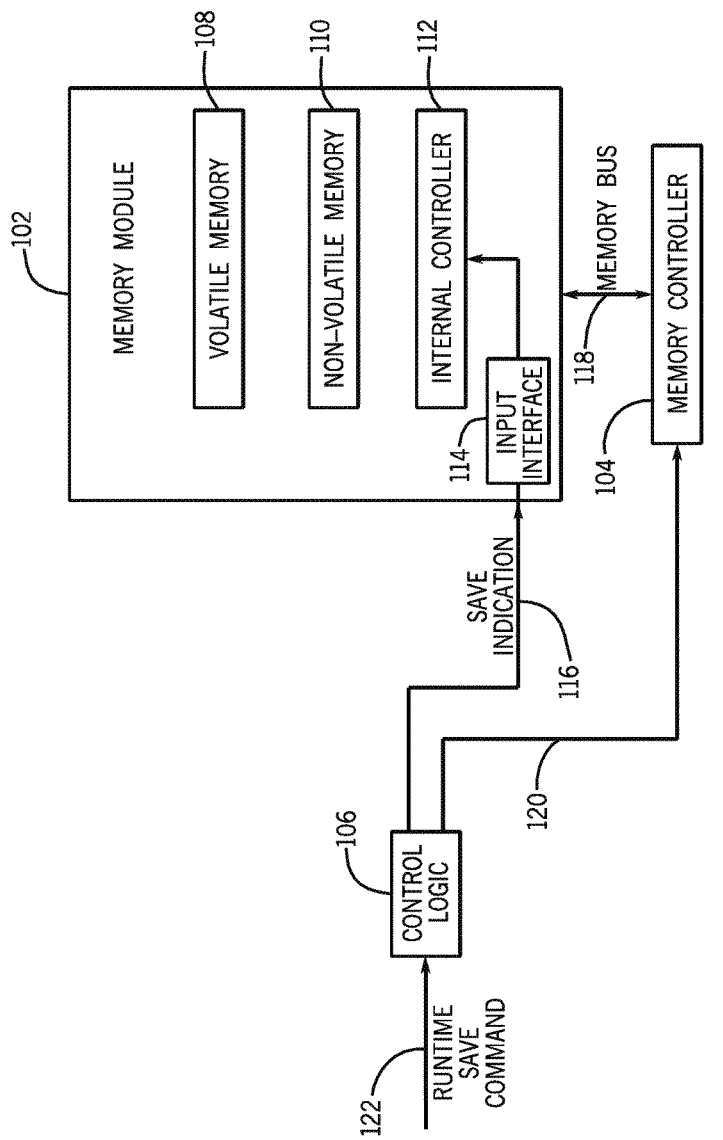
FIG. 1 is a block diagram of an example arrangement that includes runtime backup logic according to some implementations.

A memory module can be used as an intermediate storage in a system, where the intermediate storage is a higher-speed storage than a persistent secondary storage of the system. The persistent secondary storage can be implemented with one or multiple disk-based storage devices, one or multiple solid state storage devices, or other type of storage devices.

The memory module can include both volatile memory and non-volatile memory. Volatile memory includes memory that loses its data content in case power is removed from the volatile memory. A non-volatile memory, on the other hand, maintains its data content even if power is removed from the non-volatile memory. Examples of volatile memory can include a dynamic random access memory (DRAM), a static random access memory (SRAM), and so forth. Examples of non-volatile memory can include a flash memory, an electrically erasable and programmable read-only memory (EEPROM), and so forth.

The memory module can be used to cache a portion of data in the persistent secondary storage. The data cached in the memory module can be updated (such as by a processor or an input/output (I/O) device). When updated, the data in the memory module can be more up-to-date than the corresponding data in the persistent secondary storage. To maintain data consistency, updated cached data can be written back from the memory module to the persistent secondary storage. However, writing back data to the persistent secondary storage, if performed too frequently, can slow down overall system performance, since a data access operation to the persistent secondary storage is a relatively slow operation.

To harden data that is contained in the volatile memory of the memory module, a backup operation can be performed to transfer (move or copy) data from the volatile memory to the non-volatile memory in the memory module. Performing a data backup operation inside the memory module does not involve data movement to the relatively slow persistent secondary storage. Hardening data in a memory module can refer to storing the data in the memory module in a manner that prevents loss of the data in case of a fault condition (e.g. power loss, system crash, etc.).

In some cases, the backup operation from the volatile memory to the non-volatile memory in the memory module can be triggered in response to an indication of power loss of the system. Power loss can cause the system to transition from a runtime state to a lower power state, such as a sleep state or hibernation state. In the lower power state, power can be removed from at least some components of the system. A runtime state of a system can refer to a state in which executable code (including applications, an operating system, or other code) is able to execute. For example, the runtime state can be an S0 state as provided by the Advanced Configuration and Power Interface (ACPI) standard. In other examples, other types of runtime states can be employed. As part of the transition from the runtime state to the lower power state, a data backup can be triggered to transfer data from the volatile memory to the non-volatile memory of the memory module.

In accordance with some implementations, for increased flexibility and enhanced system performance, backup of data from a volatile memory to non-volatile memory in a memory module can be performed during runtime of the system, rather than just as part of a transition from a runtime state to a lower power state. Runtime backup of data in the memory module refers to performing a data transfer (data copy or data move) between the volatile memory and the non-volatile memory while the system remains in the runtime state; in other words, the system does not transition to a lower power state such as sleep state or hibernation state. Note that, in some implementations, in addition to the ability to perform runtime backup of data in the memory module, data backup in the memory module from the volatile memory to the non-volatile memory can also be triggered in response to a transition of the system from the runtime state to a lower power state.

Although the present discussion refers to transferring data from volatile memory to non-volatile, note that transfers can also occur in the other direction, from the non-volatile memory to the volatile memory. Also, when the non-volatile memory fills up, data can be moved out of the non-volatile memory to write back to secondary storage.

The runtime backup of data in the memory module can be an opportunistic backup during time windows in which the system is idle. Note that, in some implementations, runtime backup of data in the memory module is not performed while the system is actively accessing data in the memory module, to avoid any potential conflicts that may occur between the runtime backup operation and data access by the system. Whenever the system detects an idle time window, a runtime backup of data in the memory module may be opportunistically triggered. Alternatively, runtime backup of data in the memory module can be triggered in response to a detection that a specified time interval has passed since the last backup of data in the memory module, or in response to another event.

FIG. 1 is a block diagram of an example system that includes a memory module 102, a memory controller 104 that manages access (read access or write access) of data stored in the memory module 102, and a control logic 106 that is able to control data backup operations in the memory module 102. In accordance with some implementations, the control logic 106 can cause a data backup operation to be performed internally in the memory module 102 during runtime of the system (where the system remains in the runtime before and after the data backup operation is performed). The runtime data backup operation can be performed opportunistically during idle time intervals, or alternatively, the runtime data backup operation can be triggered in response to a specified event. Moreover, in some examples, the control logic 106 can also trigger a data backup operation to be performed internally in the memory module 102 in response to a power state transition of the system, when the system transitions from a runtime state to a lower power state (or more generally from a higher power state to a lower power state).

The control logic 106 can be implemented with one or multiple integrated circuit chips of the system. For example, the control logic 106 can include multiple integrated circuit chips that are part of a chipset of the system. The integrated circuit chips can include a system complex programmable logic device (CPLD) and a southbridge. The southbridge of the system can be coupled to various I/O devices, and the southbridge can manage a system's I/O functions. The system CPLD can be programmed to perform specific tasks, such as to trigger a save operation in the memory module 102 to perform the internal backup operation. In other examples, instead of using a CPLD, another type of integrated circuit chip can be employed, such as a programmable gate array, an application-specific integrated circuit (ASIC) device, a microprocessor, a microcontroller, and so forth.

In other examples, the control logic 106 can be implemented with a single integrated circuit chip. Alternatively, the control logic 106 can be incorporated into the memory controller 104, or in another component of the system, such as a processor, an input/output (I/O) device, and so forth. The tasks performed by the control logic 106 can be controlled by machine-readable instructions (firmware or software) executable by processing circuit of the control logic 106.

The memory module 102 includes a volatile memory 108 and a non-volatile memory 110. In addition, the memory module 102 includes an internal controller 112, which can perform various tasks, including a data transfer to transfer data between the volatile memory 108 and the non-volatile memory 110. The transfer of data can include copying or moving of data from the volatile memory 108 to the non-volatile memory 110, or the copying or moving of data from the non-volatile memory 110 to the volatile memory 108.

The memory module 102 also includes an input interface 114 to receive a save indication 116 from the control logic 106. The save indication 116 is provided to the memory module 102 to trigger an internal backup operation from the volatile memory 108 to the non-volatile memory 110. In some implementations, the save indication 116 can be a signal that is provided to a particular input pin of the memory module 102. In some examples, the memory module 102 can be a dual inline memory module (DIMM), and the particular input pin can be a SAVE# pin as proposed by the Joint Electronic Devices Engineering Council (JEDEC). In other examples, other input pins of the memory module 102 can be used for receiving the save indication 116. The save indication 116 can be an indication to the memory module 102 that a memory bus 118 is idle such that an internal data save operation from the volatile memory 108 to the non-volatile memory 110 can be performed.

In further examples, instead of providing the save indication 116 to a particular input pin of the memory module 102, the save indication can be in the form of a command or message that is sent to the memory module 102. The command or message can be received through a combination of input pins of the memory module 102.

The memory bus 118 connects the memory module 102 to the memory controller 104. The memory bus 118 includes data signals, command signals, and address signals. During normal operation of the system, the memory controller 104 receives a data request from a data requester (not shown), which can be a processor or an I/O device. In response to the data request, the memory controller 104 generates the corresponding memory command (read command or write command) to pass over the memory bus 118. For a read command, the address associated with the read operation can also be provided over the memory bus 118, and responsive data retrieved from the memory module 102 is returned over the data signals of the memory bus 118. For a write command, the memory controller 104 also provides the write data over the data signals of the memory bus 118 to write into the memory module 102.

A control bus 120 is also provided between the control logic 106 and the memory controller 104. The control logic 106 can issue one or multiple commands to the memory controller 104 over the control bus 120. For example, the control logic 106 can issue a command to the memory controller 104 to trigger the memory controller 104 to relinquish control of the memory module 102 over the memory bus 118. Effectively, this can be accomplished by causing the memory bus 118 to become idle (by preventing the memory controller 104 from issuing any memory access commands on the memory bus 118).

By causing the memory controller 104 to relinquish control of the memory module 102 over the memory bus 118, the memory bus 118 becomes idle. Causing the memory bus 118 to become idle can be performed before an internal data backup operation is performed in the memory module 102 to transfer data from the volatile memory 108 to the non-volatile memory 110. Ensuring that there are no memory operations on the memory bus 118 during the internal backup operation of the memory module 102 avoids interference of memory operations on the memory bus 118 with the internal backup operation on the memory module 102. Note that an internal backup operation in the memory module 102 does not involve any data transfer over the memory bus 118.

As further depicted in FIG. 1, the control logic 106 can receive a runtime save command 122, which can be issued in response to machine-readable instructions, hardware logic, or user input. The runtime save command 122 is to trigger a runtime backup operation internally inside the memory module 102. Although not shown in FIG. 1, it is noted that the control logic 106 can also receive a separate command to perform an internal backup operation in the memory module 102 in response to a power state transition (e.g. transition from a runtime state to a lower power state).

Figure 2:
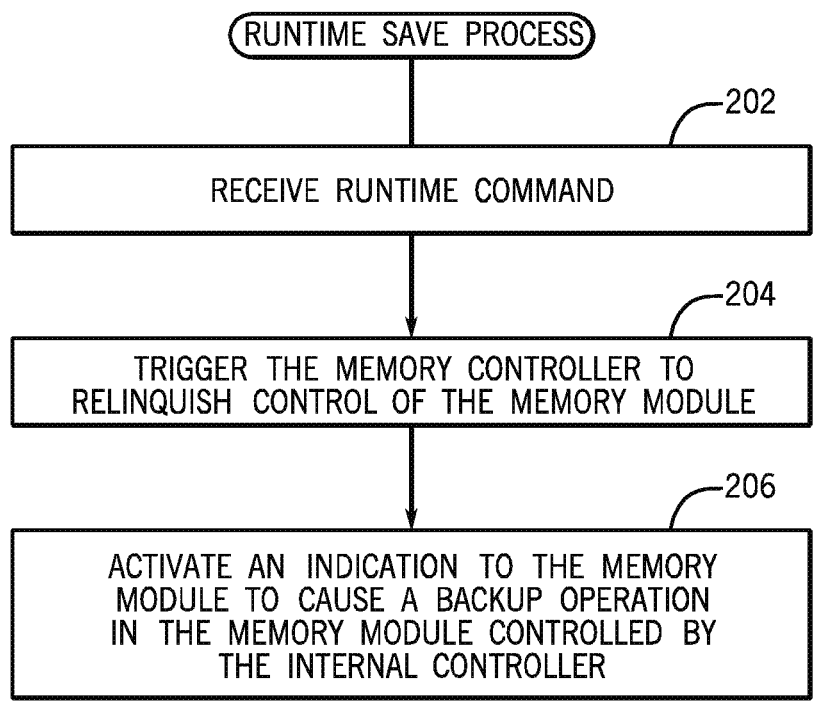
FIG. 2 is a flow diagram of a runtime backup process according to some implementations.

FIG. 2 is a flow diagram of a runtime save process according to some implementations. The runtime save process can be performed by the control logic 106 of FIG. 1, for example.

The runtime save process receives (at 202) a runtime command (e.g. runtime save command 122 in FIG. 1) to trigger a runtime data backup operation in the memory module 102. The runtime command is issued during a time window in which the system is idle (in other words, modules in the system are not actively accessing data in the memory module 102). Identifying these idle time windows allows the system to issue the runtime command to start the process of performing internal backup at the memory module 102. In examples where the volatile memory 108 is implemented with DRAMs, the idle time windows can also be referred to as asynchronous DRAM refresh (ADR) windows.

In response to the runtime command, and during runtime of the system, the control logic 106 triggers (at 204) the memory controller 104 to relinquish control of the memory module 102, which causes the memory controller 104 to no longer issue memory operations onto the memory bus 118. As a result, the memory bus 118 becomes idle.

After the triggering performed at 204, the control logic 106 activates (at 206) an indication (e.g. save indication 116 in FIG. 1) to the memory module 102. The indication causes performance of an internal data backup operation in the memory module that is controlled by the internal controller 112 of the memory module 102.

Prior to relinquishing control of the memory module 102 over the memory bus 118, the memory controller 104 can issue a self-refresh command to the memory module 102, to cause any DRAMs (that are part of the volatile memory 108) to perform self-refresh. The issuance of the self-refresh command by the memory controller 104 can be in response to a command from the control logic 106 to relinquish control of the memory bus 118. A self-refresh in a DRAM refers to a refresh controlled internally at the DRAM. Since a DRAM stores data in storage capacitors, the storage charge of the storage capacitors has to be refreshed within a given time interval to avoid loss of the storage charge (and thus loss of data). Refresh of a DRAM can be controlled by the memory controller 104. Alternatively, self-refresh can be performed at the DRAM without control by the memory controller 104, to allow the DRAM to perform automated refresh operations to corresponding portions of the DRAM to maintain storage charge stored in the storage capacitors in the corresponding DRAM portions.

Once the memory controller 104 issues the self-refresh command to the memory module 102, the memory controller 104 can become idle on the memory bus 118. At this point, any DRAM that is implemented as part of the volatile memory 108 can perform self-refresh to maintain the data stored in the DRAM.

In implementations where the volatile memory 108 is not implemented with DRAMs, then the memory controller 104 would not issue a self-refresh command to the memory module 102.

Figure 3:
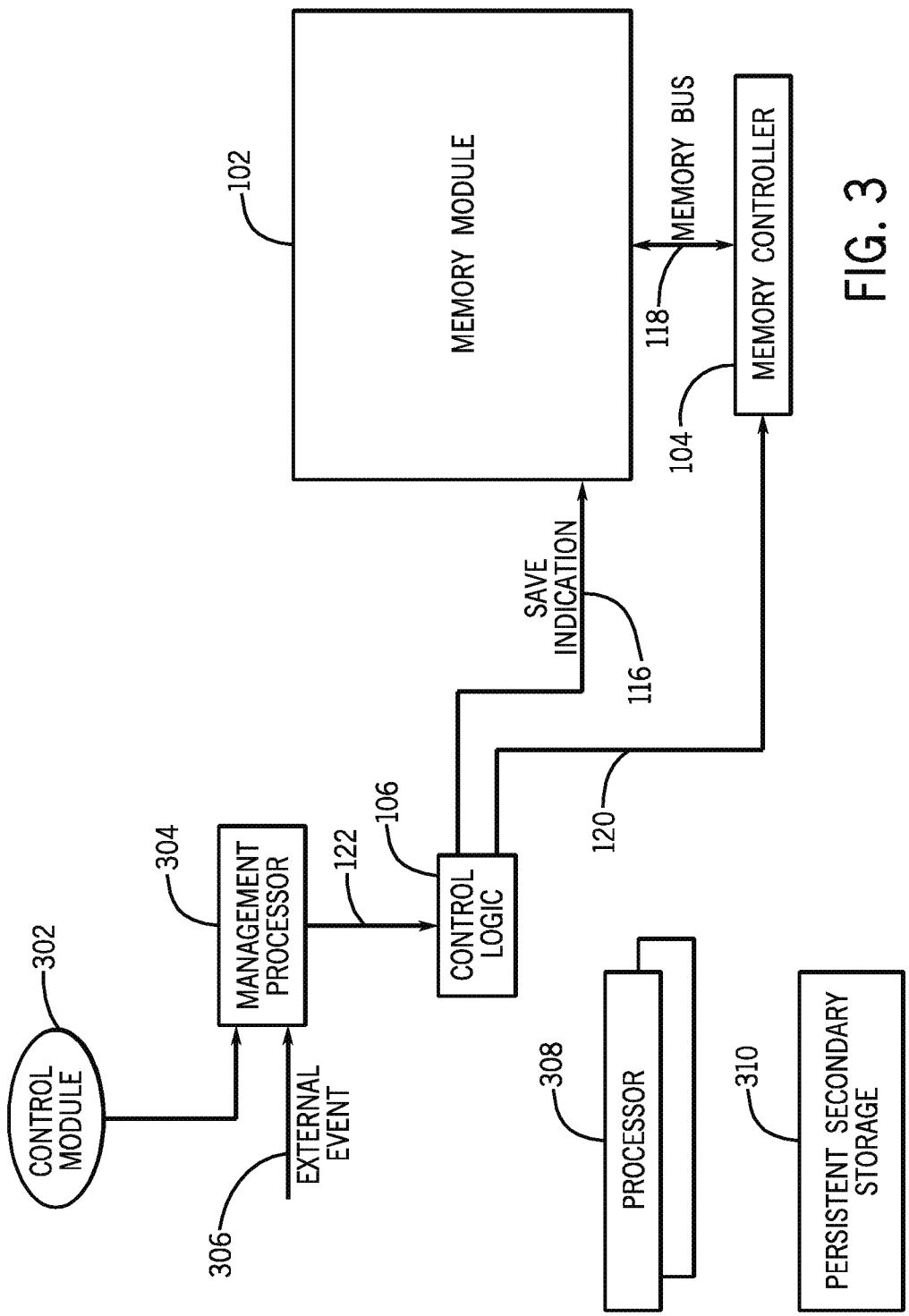
FIG. 3 is a block diagram of another example arrangement that includes runtime backup logic according to further implementations.

FIG. 3 is a block diagram of an example system according to further implementations. The system of FIG. 3 also includes the memory module 102, memory controller 104, and the control logic 106, similar to corresponding components described in connection with FIG. 1.

The system of FIG. 3 further includes a management processor 304, which is able to issue the runtime save command 122 to the control logic 106. The management processor 304 can issue the runtime save command 122 in response to an event from a control module 302 or an external event 306. The control module 302 can be implemented as machine-readable instructions executable on one or multiple processors 308 of the system. The control module 302 can be part of an operating system, part of system firmware (e.g. Basic Input/Output System code) or part of an application. The external event 306 can be a signal that is provided to an input pin of the management processor 304. The external event 306 can be activated in response to user input, for example. A user can be presented with a user interface, through which the user can request the runtime save operation.

The control module 302 can monitor the system to determine time windows during which the system may become idle such that the system would not access (write or read) data of the memory module 102 during these idle time windows. In examples where the volatile memory 108 of the memory module 102 is implemented with DRAMs, these idle time windows can be referred to as ADR windows (as noted above). Note that the system being idle is not the same as the system transitioning to a lower power state. The system can be idle while the system remains in its runtime state.

When the control module 302 determines that the system is about to become idle, the control module 302 can determine how long the system will be idle. If the length of idleness is sufficiently long, the control module 302 can send a request to the management processor 304, to cause the management processor 304 to issue the runtime save command 122 to the control logic 106 to trigger the opportunistic internal data backup operation in the memory module 102.

Alternatively, the control module 302 can force the performance of a runtime backup of data in the memory module 102, in response to a specified event. For example, the control module 302 can detect that a predefined time interval has passed since a data backup was performed in the memory module 102. Upon detecting the passage of this predefined time interval, the control module 302 can force an idle time interval in the system to allow for the performance of the runtime backup in the memory module 102. The control module 302 can also trigger the performance of runtime in response to other event(s).

In this way, the control module 302 is able to intermittently (e.g. periodically or repeatedly at non-periodic intervals) specify asynchronous time windows during which internal data backup operations in the memory module 102 can be performed. Each asynchronous time window allows at least a portion of the content of the volatile memory 108 to be transferred from the volatile memory 108 to the non-volatile memory 110 of the memory module 102. Thus, the internal data backup operation can be divided into multiple smaller transactions within respective asynchronous time windows in which the memory module 102 performs internal data backup operations of respective portions of data from the volatile memory 108 to the non-volatile memory 110.

The system of FIG. 3 also includes a persistent secondary storage 310, which can be implemented with slower storage devices than the memories in the memory module 102.

By employing techniques or mechanisms according to some implementations, internal data backup operations of the memory module 102 can be performed in scenarios that are in addition to power-loss scenarios. The data backup operations can be performed as part of checkpointing of a database. Database checkpointing refers to creating a persistent version of a portion of the database at specified intervals. Database checkpointing can be performed at periodic intervals. Thus, the ability of the control module 302 to force the runtime backup in the memory module 102 is a feature that can be used as part of database checkpointing. Since the database checkpointing can be performed internally in the memory module 102, system performance degradation caused by frequent checkpointing performed to a persistent secondary storage can be avoided.

In other applications, the memory module 102 can be used to store other types of data, such as system hardware configuration data, operating system (OS) configuration data, user data, application data, and so forth. The ability to perform runtime backup in the memory module of any of these types of data can be useful.

Figure 4:
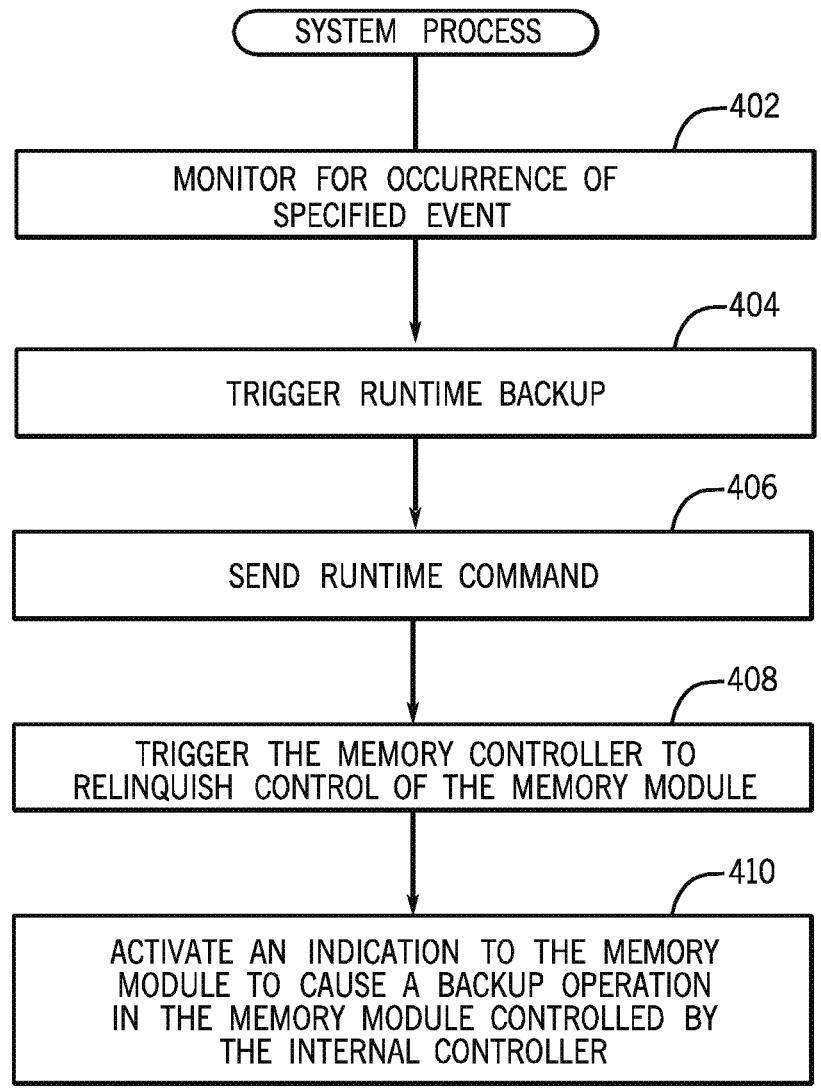
FIG. 4 is a flow diagram of a runtime backup process according to further implementations.

FIG. 4 is a flow diagram of a process that can be performed by the system depicted in FIG. 3, for example. The control module 302 can monitor (at 402) for occurrence of one of any of multiple specified events. A first such event can be the passage of a specified amount of time since a last backup was performed in the memory module 102. In response to the first event, the control module 302 can trigger (at 404) a runtime backup in the memory module 102, even if the system is busy. The control module 302 can force the memory bus 118 to become idle to allow the backup in the memory module 102 to be performed.

A second event that can be monitored for by the control module 302 is an event indicating system idleness. Upon detecting such system idleness, the control module 302 can opportunistically trigger (at 404) a runtime backup at the memory module 102.

Triggering (at 404) the runtime backup includes sending a request to the management processor 304 to cause the management processor to send (at 406) a runtime command (e.g. runtime save command 122) to the control logic 106. This causes the system to perform tasks 408 and 410, which are the same as respective tasks 204 and 206 in FIG. 2.

Machine-readable instructions of various modules described above (including the control module 302 of FIG. 3 or instructions executable by the control logic 106 of FIG. 1 or 3) are loaded for execution on a processing circuit.

Data and instructions can be stored in respective storage devices, which can be implemented as one or multiple computer-readable or machine-readable storage media. The storage media include different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A method comprising:
   during runtime of a system, triggering a memory controller to relinquish control of a memory module that includes a volatile memory and a non-volatile memory; and
   after the triggering, activating an indication to the memory module, the indication causing a backup operation in the memory module, the backup operation being controlled by an internal controller in the memory module, and the backup operation involving a transfer of data from the volatile memory to the non-volatile memory in the memory module during the runtime of the system.

2. The method of claim 1, wherein the triggering includes sending a command to the memory controller to cause the memory controller to avoid issuing data access commands on a memory bus between the memory controller and the memory module.

3. The method of claim 1, wherein the triggering includes sending a command to the memory controller to cause activation of a self-refresh command to the non-volatile memory module.

4. The method of claim 3, further comprising:
   in response to the self-refresh command from the memory controller, performing self-refresh in a dynamic random access memory (DRAM) of the volatile memory.

5. The method of claim 1, wherein the triggering and the activating the indication to the memory module are performed by a control logic in response to a runtime command.

6. The method of claim 5, further comprising receiving, by the control logic, the runtime command that is issued during a time window of idleness in the system.

7. The method of claim 6, further comprising receiving, by the control logic, a plurality of runtime commands in corresponding time windows of idleness to cause repeated performance of the triggering and the activating, wherein the repeated performance of the triggering and the activating causes corresponding backup operations of different portions of the volatile memory to the non-volatile memory.

8. The method of claim 7, further comprising a control module detecting idleness of the system and issuing the plurality of runtime commands based on the detecting.

9. The method of claim 1, wherein activating the indication comprises activating a signal to at least one input pin of the memory module.

10. A system comprising:
    a memory module having a volatile memory and a non-volatile memory; and
    a control logic to:
      receive a runtime command to perform data backup during runtime of the system,
      in response to the runtime command, issue a command to a memory controller to cause an interval of idleness on a memory bus between the memory controller and the memory module, and
      activate an indication to the memory module,
    wherein the memory module has an internal controller to, in response to the indication, perform an internal backup of data from the volatile memory to the non-volatile memory.

11. The system of claim 10, wherein the internal backup does not involve any data transfer on the memory bus.

12. The system of claim 10, wherein the indication is a signal to an input pin of the memory module.

13. The system of claim 10, further comprising a control module to detect a time window of idleness of the system, and to cause issuing of the runtime command in response to detecting the time window of idleness.

14. The system of claim 10, further comprising a control module to detect a specified event, and to cause issuing of the runtime command in response to detecting the specified event, wherein the specified event includes a passage of a predefined time duration since a last internal backup of data in the memory module.

15. An article comprising at least one non-transitory machine readable storage medium storing instructions that upon execution cause a processing circuit to:
  during runtime of a system, trigger a memory controller to relinquish control of a memory module that includes a volatile memory and a non-volatile memory; and
  after the triggering, activate an indication to the memory module, the indication causing a backup operation in the memory module, the backup operation being controlled by an internal controller in the memory module, and the backup operation involving a transfer of data from the volatile memory to the non-volatile memory in the memory module during the runtime of the system.

* * * * *